United States Patent [19]

Perry

[11] Patent Number: 4,516,245

[45] Date of Patent: May 7, 1985

[54] DIGITAL SPAN TRANSMISSION CIRCUIT

[75] Inventor: Thomas J. Perry, Phoenix, Ariz.

[73] Assignee: GTE Automatic Electric Inc., Northlake, Ill.

[21] Appl. No.: 506,568

[22] Filed: Jun. 22, 1983

[51] Int. Cl.³ .............................................. H03K 5/01
[52] U.S. Cl. ...................................... 375/17; 307/260; 340/347 DD
[58] Field of Search ............... 375/17, 25, 36; 370/42, 370/85; 307/260, 261; 340/347 DD

[56] References Cited

U.S. PATENT DOCUMENTS

| | | | |
|---|---|---|---|
| 3,757,051 | 9/1973 | Girard et al. | 375/17 |
| 3,920,898 | 11/1975 | Torpie | 375/17 |
| 4,006,304 | 2/1977 | Sell | 375/25 |
| 4,388,716 | 6/1983 | Takezoe et al. | 375/36 |
| 4,419,757 | 12/1983 | De Gennaro et al. | 375/17 |
| 4,445,222 | 4/1984 | Smitt | 375/36 |

Primary Examiner—Robert L. Griffin
Assistant Examiner—Stephen Chin
Attorney, Agent, or Firm—Frank J. Bogacz; Peter Xiarhos

[57] ABSTRACT

In a telecommunications switching system, a thick film digital span transmission circuit is connected between a digital span and a switching network of the switching system. The circuit converts unipolar switching network data to bipolar data for digital span use. The present circuit is relatively small in size and has minimal power consumption. This circuit also provides for attenuating and shaping the pulses transmitted to the digital span.

11 Claims, 4 Drawing Figures

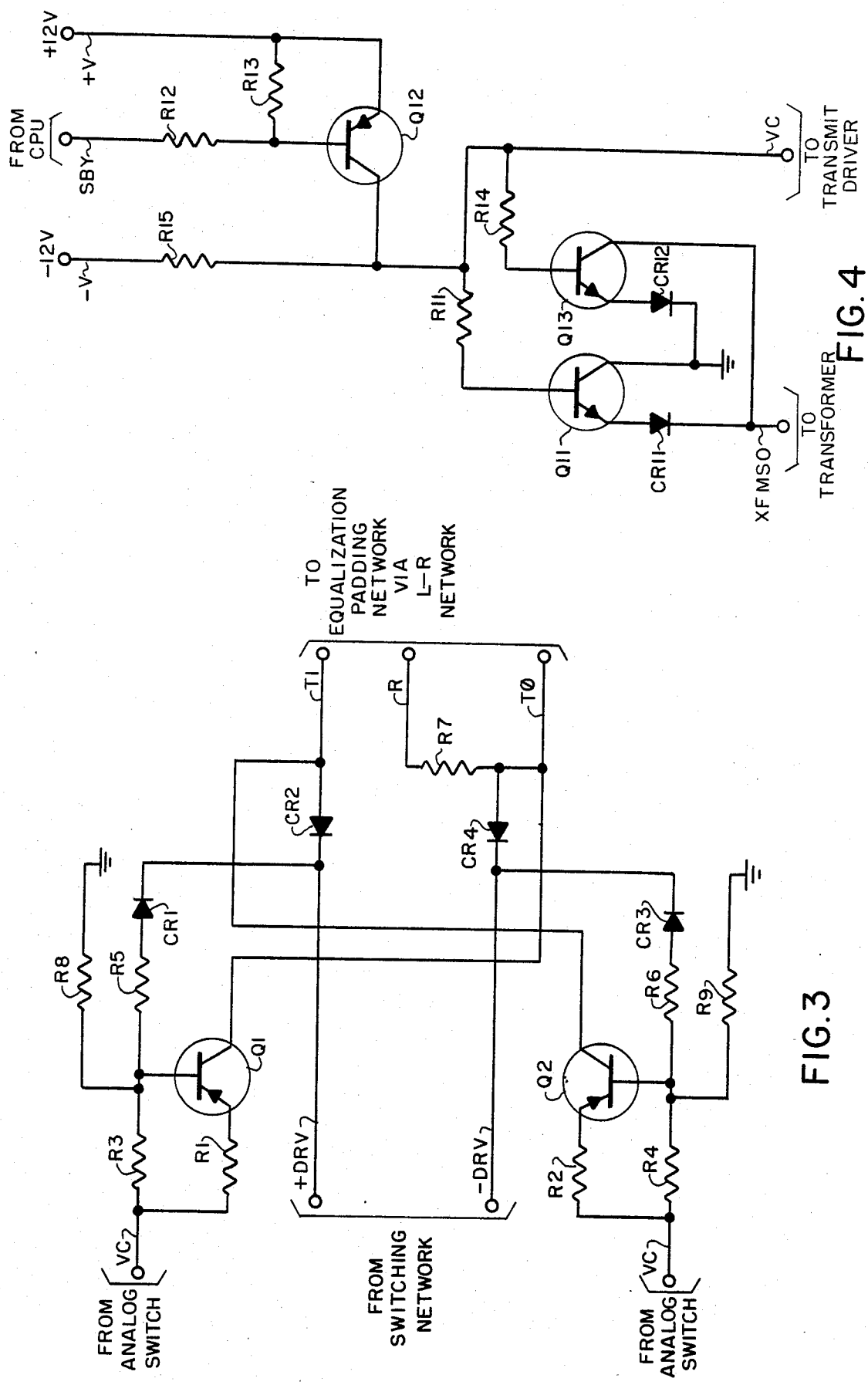

DIGITAL SPAN TRANSMISSION CIRCUIT

BACKGROUND OF THE INVENTION

The present invention pertains to digital span data transmission and more particularly to a circuit for converting unipolar switching network data to bipolar data for use with a digital span.

Available circuitry for converting unipolar switching network data to bipolar digital span data in modern switching networks, requires high power consumption. This is due to the bipolar nature of the signals being handled at the digital spans and to the magnitude of the voltage levels of these signals. Such, commonly available circuits are implemented using discrete components, thereby requiring considerable space in addition to the power consumption. These available circuits require several voltage levels for the conversion process.

With the advent of film hybrid technology, circuitry which overcomes the size and power consumption problems may be designed. However, applying this technology to digital span data transmission is not a mere routine matter.

Accordingly, it is the object of the present invention to provide a thick film digital span data transmission circuit which minimizes the use of the space and minimizes power consumption.

SUMMARY OF THE INVENTION

In a telecommunications switching system which has a CPU, a transmission circuit is connected between a digital span via a transformer and a switching network of the switching system. This transmission circuit converts unipolar data of the switching network to bipolar data for the digital span.

The switching network is connected to the transmission circuit via first and second input leads. The network operates to alternately transmit first and second input signals of a particular valve via these first and second input leads. The transformer is connected to the transmission circuit via first and second output leads.

The transmission circuit includes a first controller which is connected between the first input lead and the second output lead. This controller operates in response to the first input signal of the predetermined value to connect the first input lead to the second output lead.

A second current controller is connected between the first and second output leads. The second current controller operates in response to the first input signal of the predetermined value to permit a predetermined current to flow from the first to the second output leads via the transformer.

A third current controller is connected between the second input lead and the first output lead. This current controller operates in response to the second input signal of the predetermined value to connect the second input lead to the first output lead.

A fourth current controller is connected between the first and second output leads. This current controller operates in response to the second input signal of the predetermined value to permit a predetermined current flow from the second to the first output lead via the transformer.

A voltage controller is connected to the second and fourth current controllers. The voltage controller operates to connect a voltage level of one of two polarities to the second and fourth current controllers.

The first and second current controllers alternate operation with the third and fourth current controllers. As a result, in response to the first and second input signals the first and second current controllers alternating with the third and fourth current controllers produce the bipolar data for use by the digital span.

DESCRIPTION OF THE DRAWINGS

FIG. 3 is a schematic diagram of the transmit driver hybrid.

FIG. 4 is a schematic diagram of the analog switch hybrid.

DESCRIPTION OF THE PREFERRED EMBODIMENT

Figure 1:
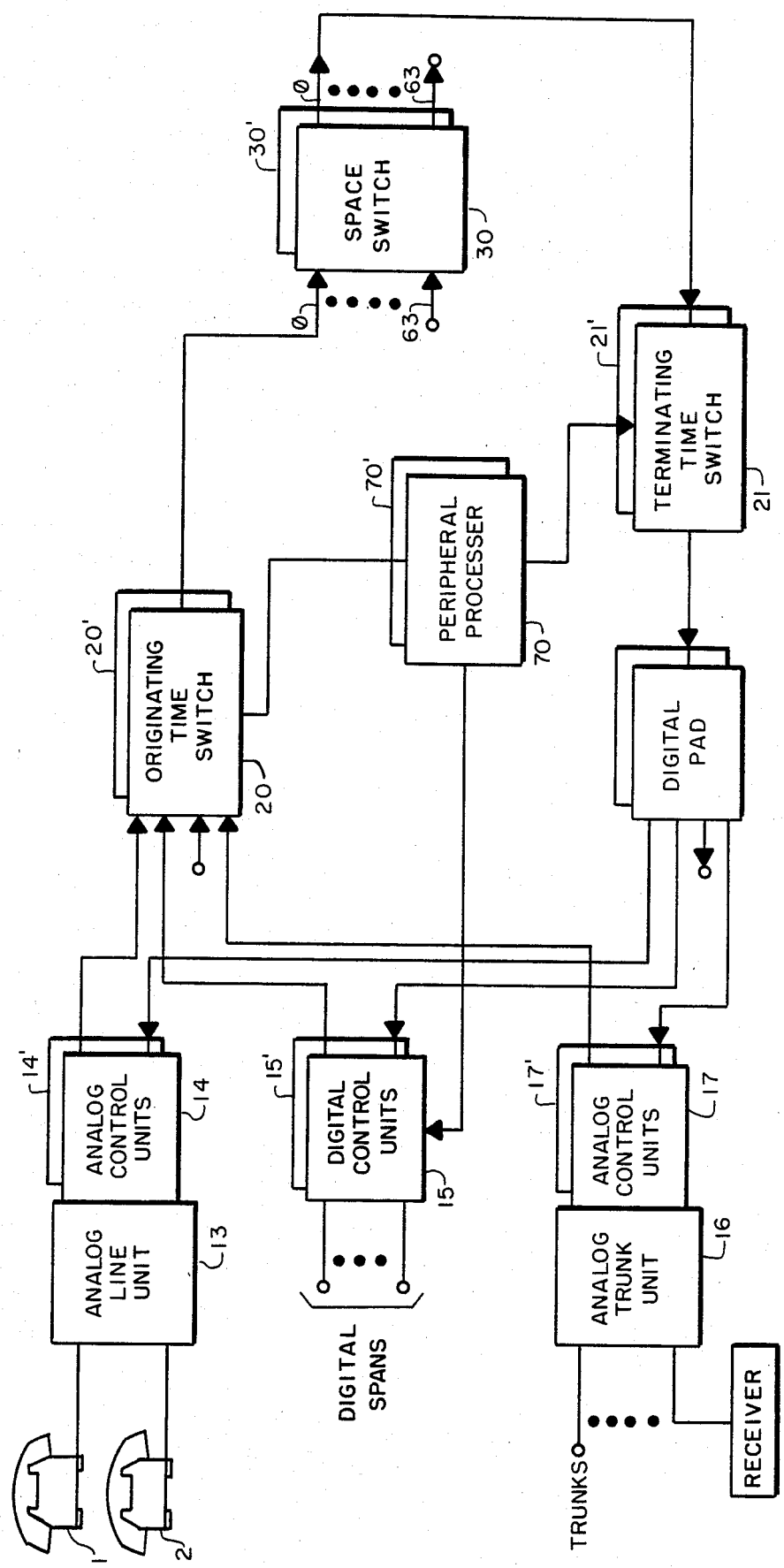
FIG. 1 is a block diagram of a telecommunications switching system embodying the present invention.

Referring to FIG. 1, a time-space-time digital switching network along with the corresponding common control is shown. Telephone subscribers, such as subscribers 1 and 2, are shown connected to analog line unit 13. Analog line unit 13 is connected to both copies of the analog control unit 14 and 14'. Originating time switches 20 and 20' are connected to duplex pair of space switch units 30 and 30' which are in turn connected to the terminating time switch 21 and 21'. Time switch and control units 21 and 21' are connected to analog control unit 14 and 14' and ultimately to the telephone subscribers 1 and 2 via analog line circuit 13.

Digital control units 15 and 15' connect the digital spans to the switching network. Digital span equipment may be implemented using a model 9004 T1 digital span manufactured by GTE Lenkurt Inc. Similarly, analog trunk unit 16 connects trunk circuits to the digital switching network via analog control units 17 and 17'.

A peripheral processor CPU 70 controls the digital switching network and digital and analog control units. Analog line unit 13 and a duplex pair of analog control units 14 and 14' interface to telephone subscribers directly. A duplicate pair of digital control units 15 and 15' control the incoming PCM data from the digital spans. Similarly, the analog trunk unit 16 and a duplex pair of analog control units 17 and 17' interface to trunk circuits. The analog and digital control units are each duplicated for reliability purposes.

Figure 2:
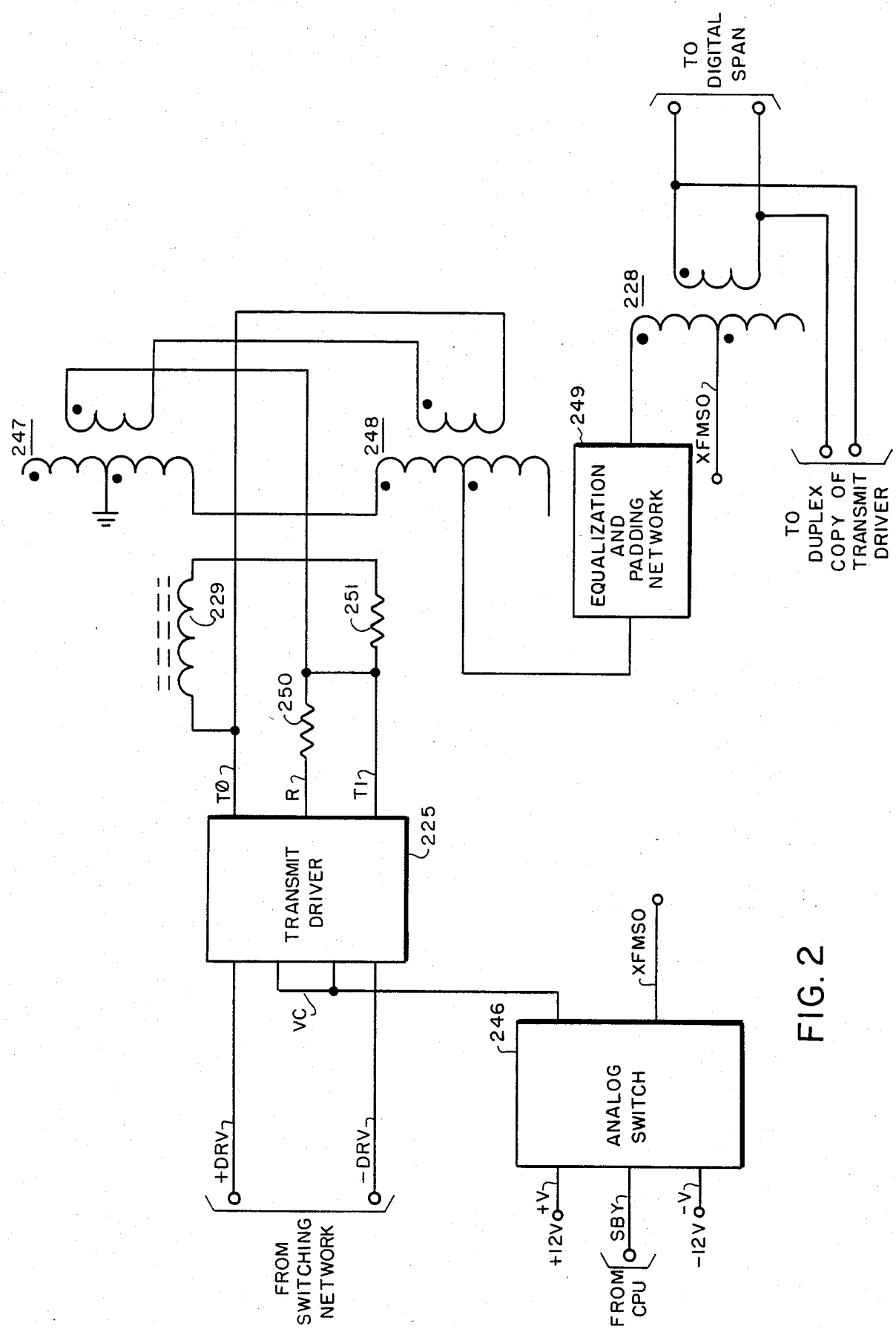
FIG. 2 is a block diagram of the transmission circuit of the present invention shown for simplex or duplex operation.

Referring to FIG. 2, a transmit driver along with an analog switch and an equalization and padding network is shown. It is to be noted that although FIG. 2 depicts a single copy of each of the above mentioned devices, there may be duplex copies, copy 0 and copy 1, located in digital control units (DCUs) 15 and 15', respectively. These transmission circuit copies provide a duplex link between the switching network and each digital span.

Transmit driver 225 is connected to the switching network via the +DRV and −DRV leads. These leads are driven by open collector peripheral drivers capable of handling 300 MA of current. Alternate logic ones appear on the +DRV and −DRV leads, connected to transmit driver 225.

Transmit driver 225 converts the unipolar signals of the switching network to bipolar signals required by the digital span. Transmit driver 225 is connected to an inductive-resistive network made up of inductor 229, resistor 250, resistor 251, and transformers 247 and 248. The output of this inductive-resistive network provides overshoot and undershoot on the rising and falling edges of the pulses from transmit driver 225. The voltage input to the inductive-resistive network is approximately 6 volts, whereas the pulses transmitted from the secondary winding of transformer 248 are approximately 12 volts.

A center tap connection of transformer 248 conducts the above mentioned output pulses to equalization and padding network 249. Equalization and padding network 249 provides an approximately 6 db attenuation for a 100 ohm load. This network provides for less attenuation at higher frequencies. The equalization and padding network 249 compensates for increased capacitive loading as cable distances between this circuit and the digital span cross-connect increase.

The output of equalization and padding network 249 is connected through transformer 228 to the digital span. For a simplex configuration, lead XFMSO of transformer 228 would be connected directly to ground and the VC leads of transmit driver 225 would be connected directly to a voltage source. For the duplex configuration mentioned above, the XFMSO lead of transformer 228 would be connected to analog switch 246. The VC lead of transmit driver 225 would also be connected to analog switch 246.

A peripheral processor (CPU) is connected to an analog switch 246 of each transmission circuit copy. The CPU operates the analog switches 246 of each copy, such that, one analog switch (and therefore transmission circuit) is active and operating and the other copy of the duplex pair is ready and standby. Analog switch 246 is connected to the CPU by the SBY lead. A logic 0 on the SBY lead indicates that the transmission circuit is in the operating and active state, whereas a logic 1 on the SBY lead indicates that it is in the ready and standby state. In the duplex configuration, analog switch 246 if enabled by the peripheral processor, produces a low impedance path to ground via the XFMSO lead, which is connected to the center tap connection of transformer 248. For the condition in which this transmitter circuit is disabled, analog switch 246 provides a high impedance condition on the XFMSO lead, which is connected to transformer 228, thereby disabling any transmission.

The transmit driver 225, the analog switch 246 and the equalization and padding network 249 may each comprise a thick film hybrid.

Referring to FIG. 3, a schematic diagram of the transmit driver of FIG. 2 is shown. When neither input +DRV or −DRV is being driven with data transmission from the switching network, resistor R7 will provide a 100 ohm termination to transformer 228. This condition is required for a digital span line that is not transmitting data. This condition is a switching industry standard.

For the condition that this transmission circuit is enabled by the peripheral processor, the VC leads will be at +12 volts. If no data is being transmitted via the +DRV lead, no current will flow through diode CR1 or resistor R5. Therefore, 200 ohm resistor R3 will pull the base of transistor Q1 to approximately +12 volts. This will turn off Q1. Although Q1 will not completely turn off, the current flow through it will be greatly reduced.

Similarly, if no data is being transmitted via the −DRV lead, no current will flow through diode CR3 or resistor R6. Therefore, 200 ohm resistor R4 will pull the base of transistor Q2 to approximately +12 volts. Since little current will flow through transistor Q2, Q2 will be essentially turned off.

Next, if data is transmitted from the switching network via the +DRV lead, the +DRV lead will be pulled to ground by a pulse. As a result, the T1 lead, which is connected ultimately to output transformer 228, will be connected to ground on the +DRV lead via diode CR2. Transistor Q2 remains turned off. Also, current will flow through resistor R3, resistor R5 and diode CR1. Resistors R3 and R5 form a voltage divider, which brings the base of transistor Q1 from its previous +12 volt level to approximately a +8 volt level. Therefore, transistor Q1 will be turned on and current will flow through resistor R1 (25 ohms), through the emitter and through the collector of transistor Q1.

As a result, transistor Q1 functions as a current source. Approximately, a voltage of +8.5 will appear at the emitter of transistor Q1. Resistor R1, nominally 25 ohms, is trimmed, such that when Q1 is turned on, approximately 120 MA of current will flow through resistor R1, through the emitter and out of the collector of transistor Q1. Approximately one-half of the 120 MA of current will flow out of the transmit driver circuit via the T0 lead via transistor Q1. The other one-half of the 120 MA of current will flow through resistor R7 and out via the R lead. The current (60 MA) will be transmitted via the T0 lead to transformer 248. Since the impedance of the line is essentially 100 ohm, a 6 volt pulse will be present at the input of transformer 248. The direction of the current flow is from transistor Q1 via the T0 lead to transformer 248.

As previously mentioned, when the +DRV lead is not transmitting data, the base of transistor Q1 is at approximately +12 volts. This condition results from a small current flow through resistors R3 and R8 to ground. Therefore, the voltage at the base of transistor Q1 is in actuality approximately +11.2 volts. As a result, a small current flows through the base-emitter junction of transistor Q1 and Q1 is never completely turned off. The base-emitter capacitance of transistor Q1 is nearly charged in this condition and this allows transistor Q1 to turn on rapidly.

Next, if data is transmitted from the switching network via the −DRV lead, the −DRV lead will be pulled to ground by a pulse. As a result, the T0 lead, which is ultimately connected to output transformer 288, will be connected to ground on the −DRV lead via diode CR4. Transistor Q1 remains turned off. Current will flow through resistors R4 and R6 and diode CR3. Resistors R4 and R6 form a voltage divider, similar to resistors R3 and R5, as mentioned above.

For data transmission on the −DRV lead, resistor R2 and transistor Q2 form a current source, similar to resistor R1 and Q1, as above. Current is now sourced from Q2 and out via the T1 lead, via transformer 247 to output transformer 228. Resistors R4 and R9 play similar functions to resistor R3 and R8, as mentioned above. Resistors R1, R3, R5 and R8 are analogous in function and value to resistors R2, R4, R6 and R9.

Since the current flow produced by transistors Q1 and Q2 is in opposite directions with respect to transformer 248, the current flow from transmiter Q1 will produce the required negative pulses and the current flow from transistor Q2 will produce the required positive pulses.

Referring to FIG. 4, a schematic diagram of the analog switch of FIG. 2 is shown. The SBY lead is connected to the peripheral processor (CPU). For a logic 0 on the SBY lead, the analog switch and consequentially the transmit driver is enabled to provide active transmission by grounding the output lead XFMSO. For a logic 1 on the SBY lead, the analog switch and the transmit driver are disabled from active transmission and remain in the ready and standby condition.

When the SBY lead is at logic 0, current will flow through resistor R12 and through the base of transistor Q12. As a result, transistor Q12 is turned on. The emitter of transistor Q12 is biased to +12 volts. Also, the collector of transistor Q12 will be at approximately 12 volts, and this voltage will be supplied to the transmit driver via the VC lead. In addition, current will flow through resistor R11 and turning on transistor Q11 as a result.

Now turning to an examination of the output XFMSO, which enables its associated transmit driver. For XFMSO to be connected to ground, there must be a path through either Q11 or Q13 to ground. Since transistor Q12 is turned on and the XFMSO lead is operating above ground potential, current will flow from the collector of transistor Q12, through resistor R14 and to the base of transistor Q13, turning it on. Therefore, current will flow from the XFMSO lead through the collector-emitter junction of transistor Q13, through diode CR12 to the ground connection of diode CR12. As a result, a low impedance connection is provided to enable output transformer 228 via the XFMSO lead.

In the situation when transistor Q12 is turned on and the XFMSO lead is operating below ground potential, current must flow out of the XFMSO lead. Current will flow out of the collector of transistor Q12, through resistor R11 to the base of transistor Q11, turning on transistor Q11. Current flows from the emitter of transistor Q11, through diode CR11 and out of the XFMSO lead. Therefore, a low impedance path is provided regardless of whether current flow is outward or inward from the analog switch via the XFMSO lead, corresponding to negative or positive pulses from the transmit driver.

Now, if the SBY lead is at logic 1, indicating the corresponding transmit driver is to be disabled and act as a ready and standby copy, no current will flow through transistor Q12. Resistors R12 and R13 and a pull-up resistor (not shown) will hold transistor Q12 turned off. With transistor Q12 turned off, pull-down resistor R15 will place approximately −13 volts on the VC lead. As a result, the −12 volts on the VC lead will disable the corresponding transmit driver.

In addition, a high impedance condition is required on the XFMSO lead to disable the associated copy of the transmit driver from the digital span, that is, no current flowing via the XFMSO lead. There must be no low impedance path for current flow in this case.

If a positive voltage is applied to the XFMSO lead, causing current to attempt to flow into the analog switch, the collector of transistor Q13 will be reversed biased. Therefore, no current can flow through the transistor Q13 junction, since the breakdown voltage of the base-collector junction exceeds the reverse bias applied voltage.

No current can flow via the XFMSO lead through transistor Q11, since CR11 prevents any current flow in this direction. Therefore, if the XFMSO lead has a positive voltage, both possible current paths are blocked by diode CR11 and transistor Q13, respectively.

If a negative voltage is applied to the XFMSO lead, any path for current to flow out of the analog switch via the XFMSO must be blocked. For current to flow through the base-collector junction of transistor Q13, the current may come from two sources. First, the current may flow via resistor R14 to the base of transistor Q13 or second, current may flow through the emitter-collector junction of transistor Q13. Diode CR12 blocks any current flow through the emitter-collector junction of Q13. For the first case, resistor R14 is approximately 1400 ohms which creates a high impedance path. In addition, transistor Q12 is turned off, so no current may flow through resistor R14 from Q12. Vitually no current can flow through the path of resistors R15 and R14, since resistor R15 is approximately 16000 ohms, a high impedance.

No current can flow through resistor R1 via the emitter-base junction of transistor Q11 because of diode CR11. No current can flow through resistor R11 via the collector-base junction of transistor Q11 because that junction is reversed biased and the breakdown voltage will not be exceeded by the reverse bias. Therefore, there is no low impedance path for current to flow out of transistors Q13 via the XFMSO lead.

If the negative voltage remains applied to the XFMSO lead, no current path must also exist through transistor Q11. Since the voltage at the base of transistor Q11 is approximately at −12 volts due to resistor R15, the base-emitter junction of Q11 is reversed biased. Transistor Q11 is turned off and no current flows through the collector-emitter junction or through the base-emitter junction of Q11.

Therefore, if the SBY lead is at logic 1, the XFMSO lead will always be a high impedance output.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. In a telecommunications switching system having a CPU, a transmission circuit being connected to a digital span via a transformer and connected to a switching network via first and second input leads of said switching system for converting unipolar data of said switching network to bipolar data for said digital span, said transmission circuit comprising:

said switching network being operated to alternately transmit first and second input signals of a first value via said first and second input leads;

said transformer connected to said transmission circuit via first and second output leads;

first current control means connected between said first input lead and said second output lead and being operated in response to said first input signal of a first value to connect said first input lead to said second output lead;

second current control means connected between said first and second output leads, said second current control means being operated in response to said first input signal of said first value to permit a predetermined current to flow from said first to said second output lead via said transformer;

third current control means connected between said second input lead and said first output lead and being operated in response to said second input signal of a first value to connect said second input lead to said first output lead;

fourth current control means connected between said first and second output leads, said fourth current control means being operated in response to said second input signal of said first value to permit a predetermined current to flow from said second to said first output lead via said transformer; and voltage control means connected to said second and to said fourth current control means and being operated to transmit a voltage to said second and fourth current control means for providing a voltage level of a first polarity or alternately to provide a voltage level of a second polarity;

said first and second current control means being operated alternately with said third and fourth current control means in response to said first and said second input signals, respectively, to produce said bipolar data.

2. A transmission circuit as claimed in claim 1, said first current control means including a diode having a cathode connected to said second output lead and having an anode connected to said first input lead.

3. A transmission circuit as claimed in claim 1, said third current control means including a diode having a cathode connected to said first output lead and having an anode connected to said second input lead.

4. A transmission circuit as claimed in claim 1, said second current control means including:
first voltage divider means connected between ground and a voltage source;
first transistor means having a base, an emitter and a collector lead, said base lead being connected to said first voltage divider and said collector lead being connected to said first output lead;
first diode means connected between said first voltage divider means and said second output lead;
first resistor means connected to said emitter lead of said first transistor means and to a common connection of said first voltage divider means and said voltage source; and
second resistor means connected between ground and said base lead of said first transistor means and being operated to produce a trickle current through said first transistor means.

5. A transmission circuit as claimed in claim 4, wherein there is further included third resistor means connected between a center tap lead of said transformer and said first output lead.

6. A transmission circuit as claimed in claim 5, wherein there is further included an inductive-resistive network connected between said first and second output leads and said center tap lead and said transformer for shaping said bipolar data.

7. A transmission circuit as claimed in claim 6, wherein there is further included an equalization and padding network connected between said inductive-resistive network and said transformer via said first and second output leads and said center tap lead, said equalization and padding network operated to attenuate and to shape said bipolar data.

8. A transmission circuit as claimed in claim 5, said fourth current control means including:
second voltage divider means connected between ground and a voltage source;
second transistor means having a base, an emitter and a collector lead, said base lead being connected to said second voltage divider means and said collector lead being connected to said second output lead;
fourth resistor means connected to said emitter lead of said second transistor means and to a common connection of said second voltage divider means and said voltage source; and
firth resistor means connected between ground and said base lead of said second transistor means and being operated to produce a trickle current through said second transistor means.

9. A transmission circuit as claimed in claim 1, said first, second, third and fourth current control means collectively comprising a thick film hybrid.

10. A transmission circuit as claimed in claim 1, said voltage control means comprising a thick film hybrid.

11. A transmission circuit as claimed in claim 8, said voltage control means including third transistor means connected to said voltage source, to said CPU and to said second and fourth current control means.

* * * * *